United States Patent [19]

Jarcy

[11] Patent Number: 6,104,230

[45] Date of Patent: Aug. 15, 2000

[54] ELECTRONIC INDUCTOR CIRCUIT USING CASCODED TRANSISTORS

[75] Inventor: Michael J. Jarcy, Tustin, Calif.

[73] Assignee: Conexant Systems, Inc., Newport Beach, Calif.

[21] Appl. No.: 09/153,952

[22] Filed: Sep. 16, 1998

[51] Int. Cl.[7] .......................... H03K 17/615; H03H 11/48
[52] U.S. Cl. ........................ 327/483; 327/427; 327/433; 333/2; 455/557
[58] Field of Search ................................. 327/482, 483, 327/437, 427, 433; 379/90.01, 100.09; 331/215; 333/214; 455/557

[56] References Cited

U.S. PATENT DOCUMENTS

| | | | |
|---|---|---|---|
| 3,623,133 | 11/1971 | Ashby | 333/80 |
| 4,812,785 | 3/1989 | Pauker | 333/215 |
| 6,028,496 | 2/2000 | Ko et al. | 333/241 |

*Primary Examiner*—Dinh T. Le
*Attorney, Agent, or Firm*—Price Gess & Ubell

[57] ABSTRACT

An electronic inductor circuit comprises a pair of cascoded Darlington bipolar or MOSFET transistors, configured such that the impedance presented by the collector (drain) of the top transistor of the electronic inductor is increased, relative to the other resistive components in the electronic inductor circuit and DAA. The impedance is increased to a magnitude such that small fluctuations in the collector (drain) impedance do not vary the over-all electronic inductor circuit impedance. Therefore, as heat generated by the circuit causes the impedance of the transistor in the electronic inductor to change, the impedance change does not adversely affect over-all modem circuit performance.

18 Claims, 6 Drawing Sheets

ELECTRONIC INDUCTOR CIRCUIT USING CASCODED TRANSISTORS

BACKGROUND OF THE INVENTION

1. Field of the Invention

The present invention relates to the field of electronic circuits, and more particularly, to an electronic inductor circuit comprising cascoded transistors, for use in high-speed modem data access arrangements (DAAs).

2. Description of Related Art

FIG. 1 is a block diagram illustrating the major components of a typical analog data modem 2. A modem 2 consists of a Data Access Arrangement ("DAA") 4, a coder/decoder ("CODEC") 14, a Digital Signal Processor ("DSP") 16, and a microcontroller 18. In certain embodiments, the DSP 16 and the microcontroller 18 may be part of the host computer controller.

In small form factor modems, such as PCMCIA card modems, space is a limiting factor for the modem circuit design. Certain circuits from standard half-card modems cannot be directly transferred to smaller modem platforms. One such circuit is the electronic inductor circuit 8 in the DAA 4. The modem DAA circuit 4 provides an interface between the telephone line and the modem chip-set. The DAA 4 includes a voltage isolation transformer or opto-coupler 6 to isolate the modem chip-set from the line, a relay 10 for going on and off-hook, a ring detection and surge protection circuit 12, and an electronic inductor circuit 8. In order to go off-hook and notify a central office that the modem 2 wishes to make a call, the modem must draw loop current from the telephone line. The electronic inductor circuit 8 is the circuit that performs this task. However, while the electronic inductor circuit 8 presents a low DC impedance, it must still maintain a high AC impedance.

The electronic inductor circuit 8 must also sink between 20 mA to 80 mA of loop current in order to keep the telephone line in the off-hook state. This amount of current causes heat to be generated. On a standard half-card modem the heat is easily dissipated due to the use of large components and the free space on the printed circuit board. When moving to a smaller form factor, however, the heat created from the loop current is difficult to adequately dissipate and will cause certain electrical parameters of the circuit to change. Specifically, the AC impedance presented by the electronic inductor 8 will decrease as the modem card heats up. The heat generated will change the impedance of the circuit from its original cold-state value to an operational steady-state value. It takes the circuit approximately five minutes to reach the operational steady-state. The impedance change is illustrated by the graph shown in FIG. 3. After 30 seconds, the over-all electronic inductor circuit impedance (i.e. the impedance seen by the rest of the DAA circuit) is approximately 26 K$\Omega$. However, after four minutes, the over-all circuit impedance of the electronic inductor circuit decreases to approximately 24.25 K$\Omega$.

In high-speed modem designs, "echo cancellation" is used to allow full duplex (simultaneous send and receive) communications between two modems. Echo cancellation is performed in part by the modem DSP 16 and in part by the DAA 4. Using echo cancellation, a modem detects its own reflected signal (echo) and "cancels" this signal out in order to receive the other modem's signal. As the impedance of the electronic inductor changes, the amount of echo the modem receives changes. The DSP 16, however, is unable to compensate quickly enough to prevent transmission errors from seriously degrading modem performance.

A typical prior art electronic inductor circuit 30 is shown in FIG. 2. Two transistors 441, 442 are arranged in a common Darlington pair configuration 44. Two resistors 34, 36 bias the Darlington pair such that it is active (i.e. turned on). A DC loop current from the phone line (attached at an input node 32) is drawn through the transistor 44 and an emitter resistance 40 to ground 42. A capacitor 36 shorts the base of the Darlington pair transistor 44 so that any AC signal is grounded. Typical component values for the electronic inductor circuit are:

$R_{34}$=62K$\Omega$ $R_{38}$=75K$\Omega$ $R_{40}$=51K$\Omega$ $C_{36}$=10 $\mu$F $Q_{44}$=CXTA27 (Central Semi. part number)

The impedance of a conventional prior-art electronic inductor circuit 30 looking into the collector of the Darlington pair 44 has been thought to be several orders of magnitude greater than any other resistive elements in the circuit. If, in fact, the impedance of the electronic inductor circuit were high, slight changes in the impedance caused by heat would have little affect on the hybrid tuning. However, measurements on the electronic inductor circuit used in commercial half-card modem designs show that the impedance looking into the collector of the Darlington pair typically ranges from between 0K and 60K ohms. At these relatively low impedance levels, a slight change in magnitude can adversely affect the hybrid tuning, in turn causing a significant degradation in modem performance, especially for high-speed modems. The modem DSP 16 is unable to compensate rapidly enough for the changes caused by the impedance change of the electronic inductor 8, causing a reduction in modem performance. Thus, the impedance of the electronic inductor is a critical parameter in the hybrid tuning of a modem DAA, and therefore any heat-induced impedance changes need to be minimized.

One attempted prior solution replaced the Darlington bipolar transistor with a MOSFET device. This circuit design exhibited similar problems, however. Another solution uses either an op-amp or a custom ASIC to increase or decrease the amount of base current in the Darlington transistor in order to adjust the impedance of the electronic inductor circuit. This solution is too expensive, however, since it requires adding significant extra circuitry.

SUMMARY OF THE INVENTION

An electronic inductor circuit comprises a pair of cascoded Darlington bipolar or MOSFET transistors, configured such that the impedance presented by the collector (drain) of the top transistor of the electronic inductor is increased, relative to the other resistive components in the electronic inductor circuit and the DAA. The impedance is increased to a magnitude such that small fluctuations in the collector (drain) impedance do not vary the over-all electronic inductor circuit impedance. Therefore, as heat generated by the circuit causes the impedance of the transistor in the electronic inductor to change, the impedance change does not adversely affect over-all modem circuit performance.

BRIEF DESCRIPTION OF THE DRAWINGS

The exact nature of this invention, as well as its objects and advantages, will become readily apparent from consideration of the following specification as illustrated in the accompanying drawings, and wherein.

DETAILED DESCRIPTION OF THE PREFERRED EMBODIMENTS

The following description is provided to enable any person skilled in the art to make and use the invention and sets forth the best modes contemplated by the inventor for carrying out the invention. Various modifications, however, will remain readily apparent to those skilled in the art, since the basic principles of the present invention have been defined herein specifically to provide an electronic inductor circuit for use in highspeed modem DAAs.

The present inventor has noted that in the prior art electronic inductor designs, the magnitude of the impedance looking into the collector of the Darlington pair is on the same order as the other circuit resistive elements. If, however, the impedance looking into the collector of the electronic inductor were at least an order of magnitude higher than the other circuit elements, then small heat induced changes in the impedance would not cause significant performance degradation.

For example, consider a circuit having two resistors $R_1$ and $R_2$ arranged in parallel. The resistance of two resistors in parallel is given by the following well-known formula:

$$(R_1 * R_2)/(R_1 + R_2)$$

If $R_1$ is equal to 1 MΩ and $R_2$ is equal to 1 kΩ, then the parallel resistance equals 999 Ω, or basically the value of $R_2$. If the value of $R_1$ is halved to 500 kΩ, and the value of $R_2$ is unchanged, the parallel resistance is equal to 998 Ω, which again is basically the value of $R_2$. Since $R_1$ is so much greater than $R_2$, changing the value of $R_1$ by ½ has virtually no affect on the circuit resistance. Thus, if the impedance looking into the collector of the electronic inductor is made to be at least an order of magnitude higher than the other resistive circuit elements, then small heat induced changes in the impedance will not adversely affect the circuit performance.

Figure 4:
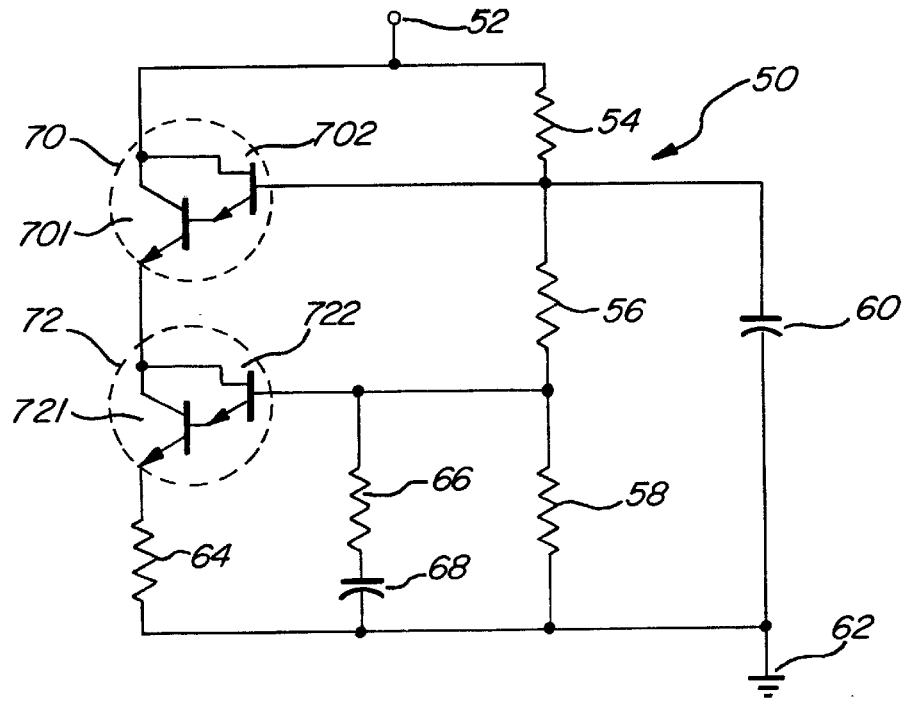
FIG. 4 is a schematic of a first embodiment of an electronic inductor circuit according to the present invention.

With reference to FIG. 4, the construction and operation of the present invention will now be described. The three resistors 54, 56, 58 bias the two Darlington pair transistors 70, 72 such that the transistors 70, 72 are active (i.e. turned "on"). The two Darlington pairs 70, 72 each consist of two transistors 701, 702 and 721, 722, respectively, arranged in the well-known Darlington configuration. The Darlington pairs 70, 72 are cascoded together. A DC loop current from the phone line (attached at an input node 52) is drawn through the transistors 70, 72 and an emitter resistance 64 to ground 62. A capacitor 60 shorts the base of the first Darlington pair transistor 70 so that any AC signal is grounded. A resistor 66 and a capacitor 68 are connected between the base of the second Darlington pair 72 and ground 62. The second Darlington pair transistor 72 operates to increase the input impedance of the circuit. The input impedance is increased by a factor of the impedance looking into the collector of the first Darlington pair 70 ($r_{O1}$) multiplied by the gain of the fist pair 70 ($gm_1$).

Representative component values for the preferred embodiment are:

$R_{54}$=10KΩ $R_{56}$=45KΩ $R_{58}$=60KΩ $R_{64}$=50KΩ $R_{66}$=3KΩ

$C_{60}$=22 µF $C_{68}$=10 µF $Q_{701,721}$=CXT3019 (Central Semiconductor part number)

$Q_{702,722}$=BRS19A (Phillips) or MMBT5551 (Motorola).

With these typical component values, the input impedance looking into the collector of the first Darlington pair 70 is approximately 230 KΩ.

Figure 1:
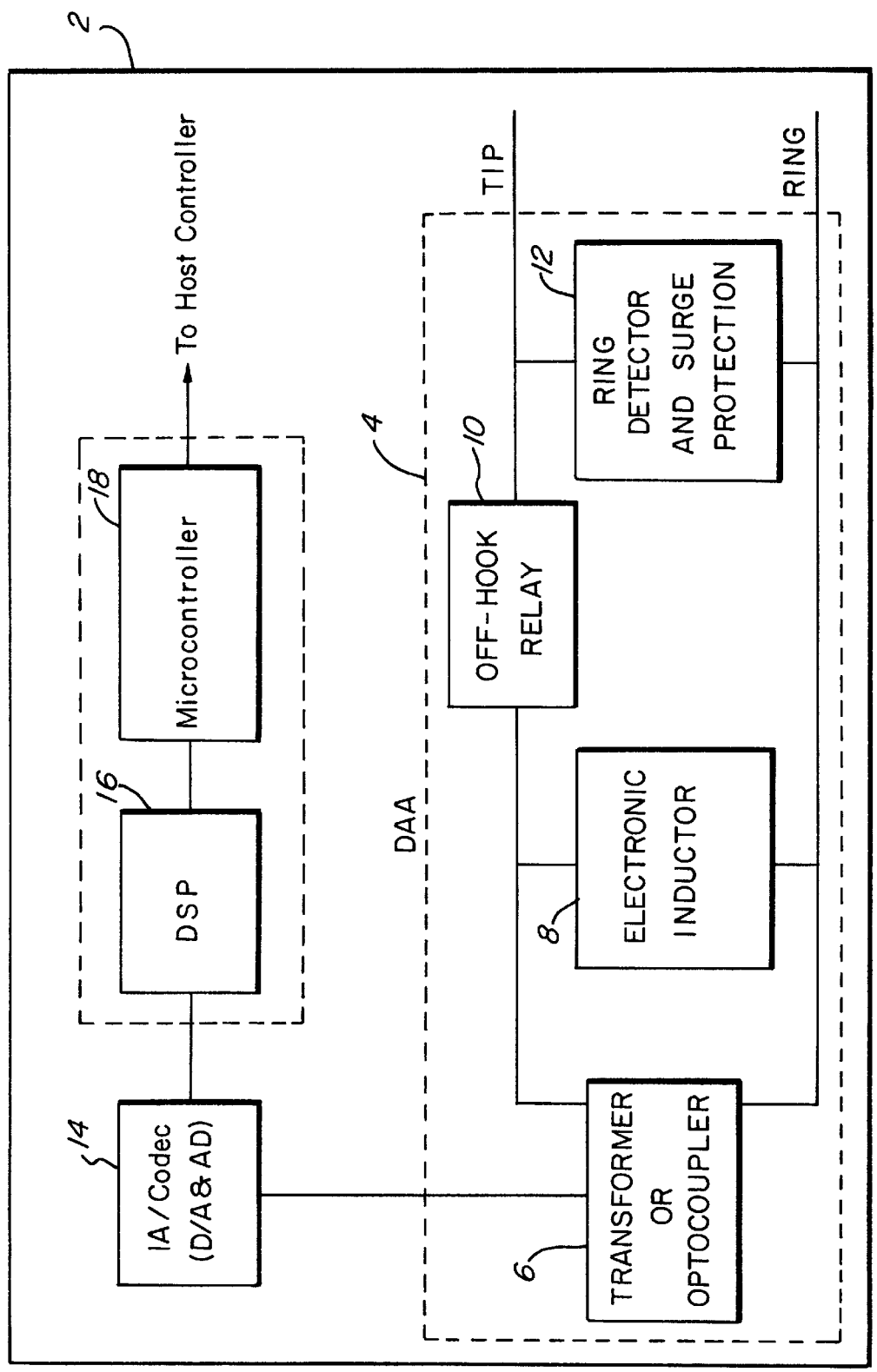
FIG. 1 is a block diagram of a typical analog data modem.
Figure 2:
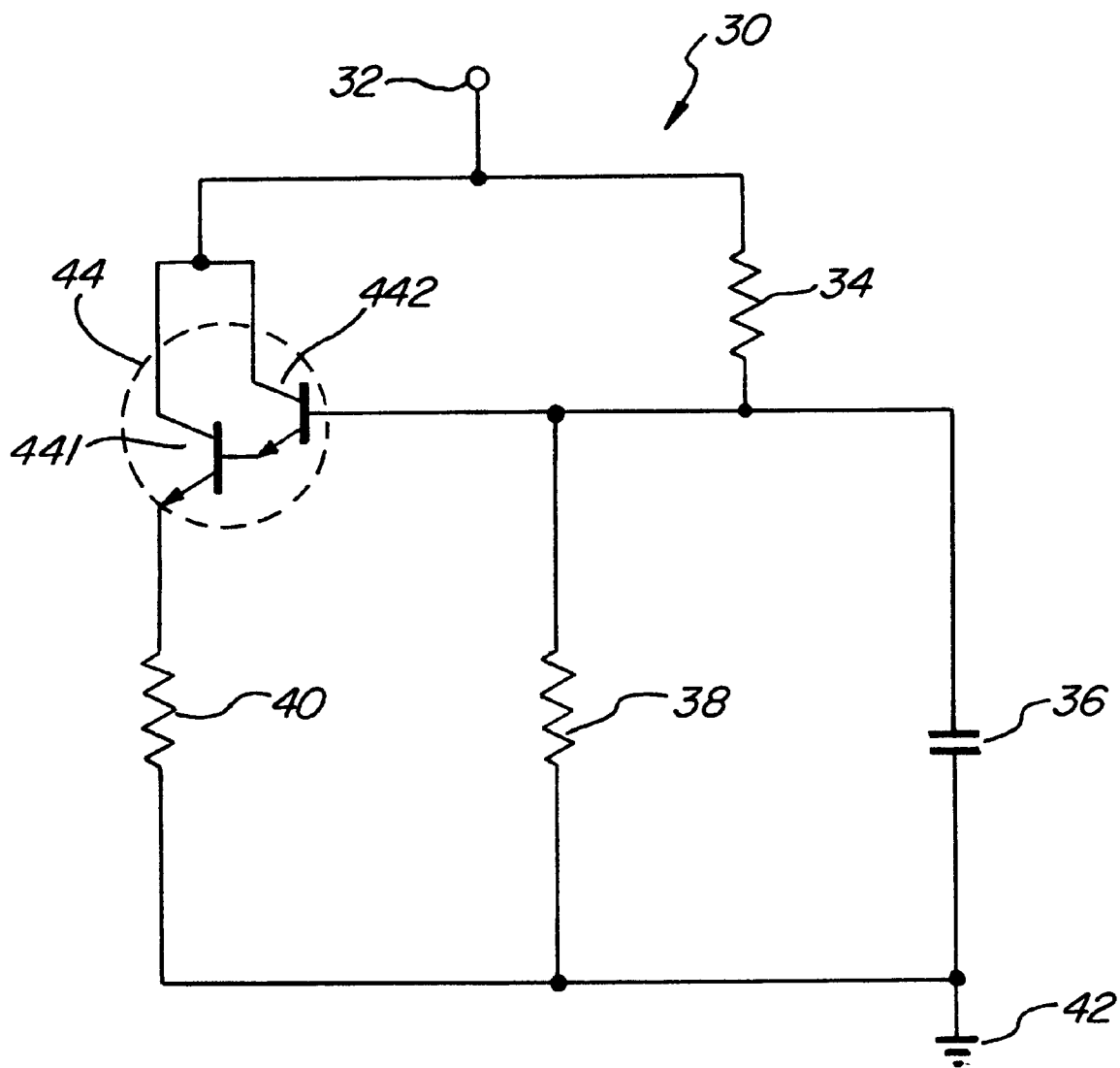
FIG. 2 is a schematic of a prior art electronic inductor circuit.
Figure 3:
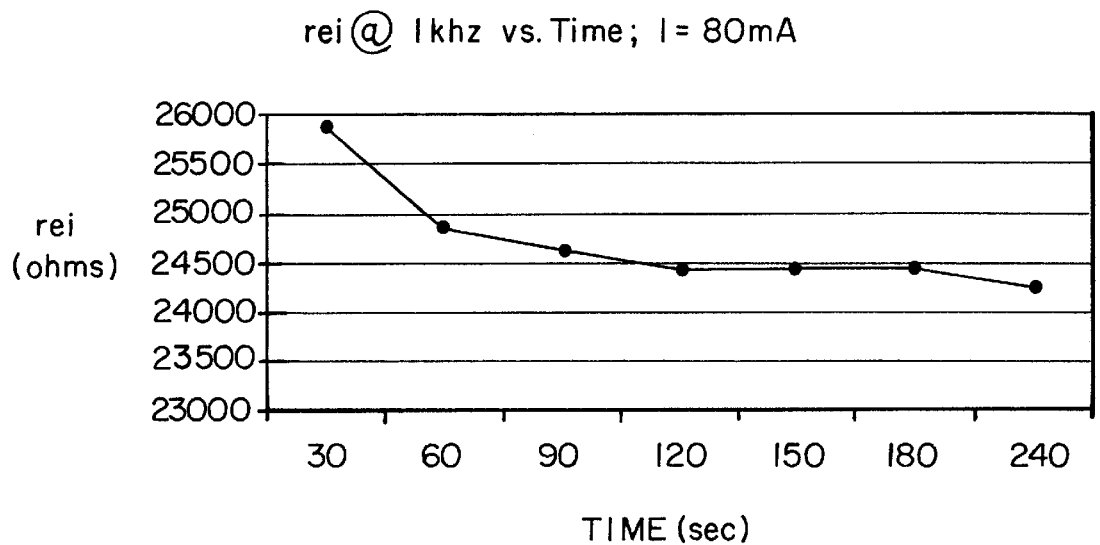
FIG. 3 is a graph illustrating the change in impedance of the prior art electronic inductor circuit as a function of time.
Figure 6:
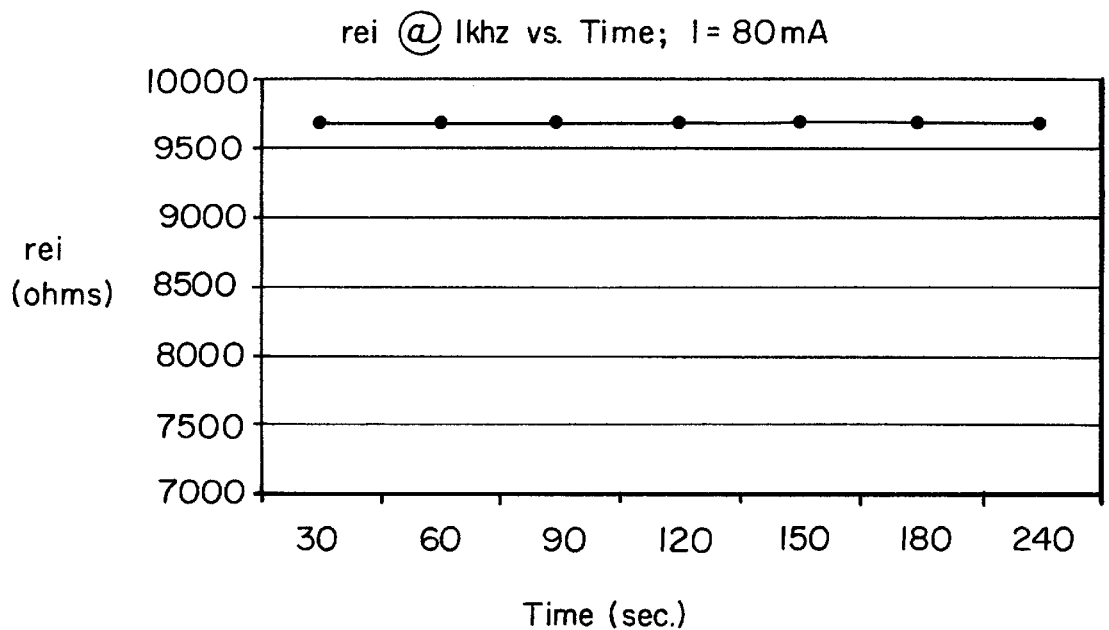
FIG. 6 is a graph illustrating the change in impedance of an electronic inductor circuit according to the present invention as a function of time.

Thus, the input impedance looking into the collector of the electronic inductor circuit 50 is increased by approximately 10–100 orders of magnitude as compared to other circuit components (specifically, the three bias resistors 54, 56, 58). Since the input impedance of the electronic inductor circuit is now much greater than the other resistive circuit elements, the transient changes which occur as the circuit is heated during operation have a much smaller effect than in the prior art circuit of FIG. 2. As illustrated in FIG. 6, the over-all circuit impedance (i.e. the impedance seen by the rest of the DAA circuit) of the electronic inductor circuit is constant with temperature at approximately 10 KΩ. The modem DSP 16 can therefore set the proper echo cancellation parameters at modem initialization, and the transient temperature changes do not adversely affect the modem performance.

Also, even though the over-all circuit impedance of the electronic inductor has decreased (24 KΩ in the prior art circuit vs. 10 KΩ for the present invention), the combination of the electronic inductor and the other DAA circuit elements still present a relatively low DC input impedance to the telephone line. Appropriate modifications of the three bias resistors 54, 56, 58 could also provide an over-all circuit impedance of 24 KΩ, if desired. The present inventor has determined, however, that the DAA performs satisfactorily with the circuit impedance at 10 KΩ. Note that there still is a very small change in the input impedance looking into the collector of the first Darlington pair 70 caused by the heat of the circuit as shown in FIG. 6. The impedance change, however, is not as detrimental to the circuit operation since the magnitude of the impedance is so much greater than the resistance of the bias resistors 54, 56, 58.

Figure 5:
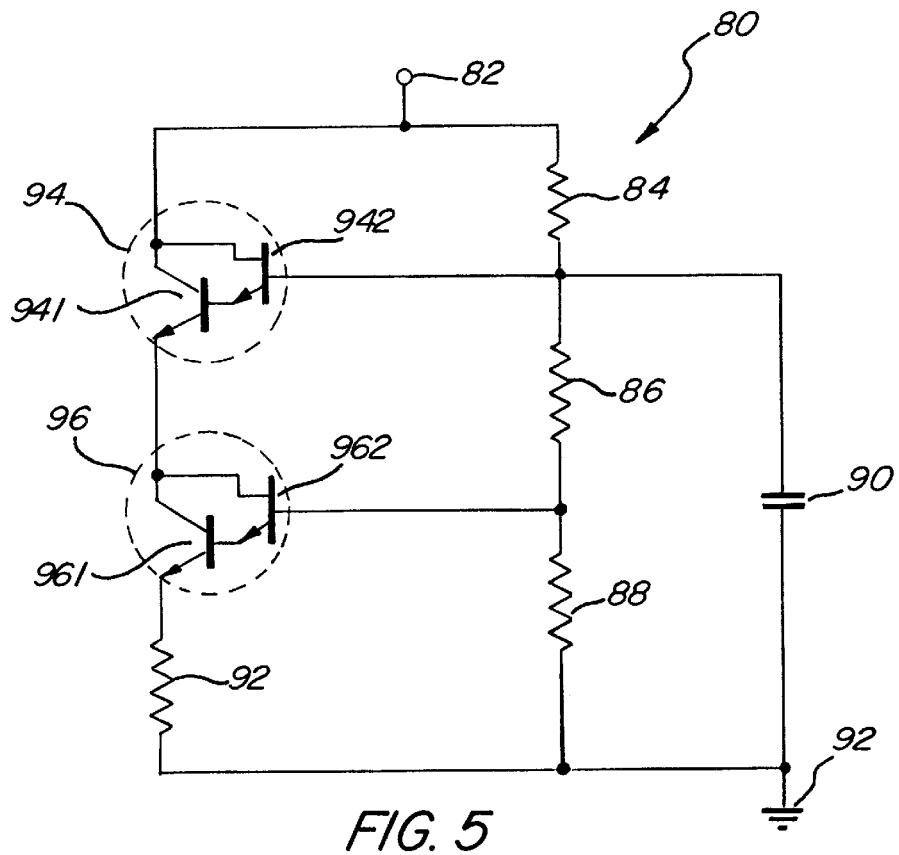
FIG. 5 is a schematic of a second embodiment of an electronic inductor circuit according to the present invention.

A second embodiment of the present invention is shown in FIG. 5 for use with telephone circuit simulators. In this circuit, the resistor 66 in and the capacitor 68 from FIG. 4 have been removed.

Figure 7:
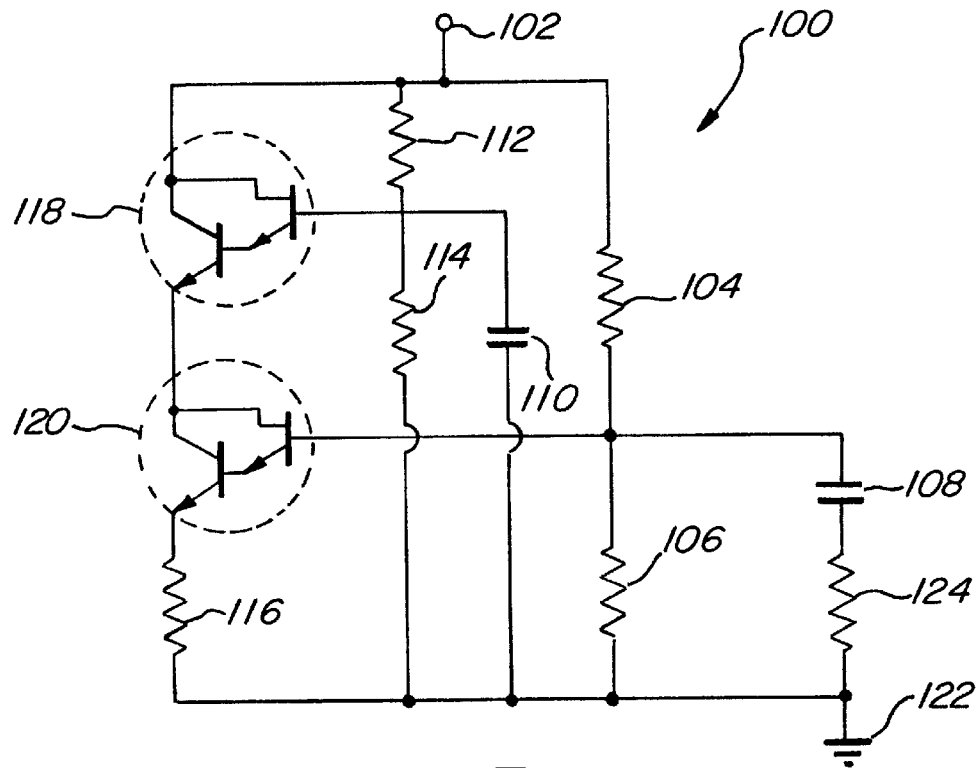
FIG. 7 is a schematic of a third embodiment of the present invention illustrating an alternative biasing configuration.

FIG. 7 illustrates a third embodiment of the present invention that employs an alternative biasing scheme. Specifically, four bias resistors 104, 106, 112, 114 are used to bias the Darlington pairs, instead of the three bias resistors shown in FIG. 5. Typical component values for this embodiment are:

$R_{104}$=55KΩ  $R_{106}$=60KΩ  $R_{112}$=20KΩ  $R_{114}$=210KΩ

$R_{116}$=50Ω

$R_{124}$=3KΩ $C_{110}$=10 µF $C_{108}$=1 µF

Figure 8:
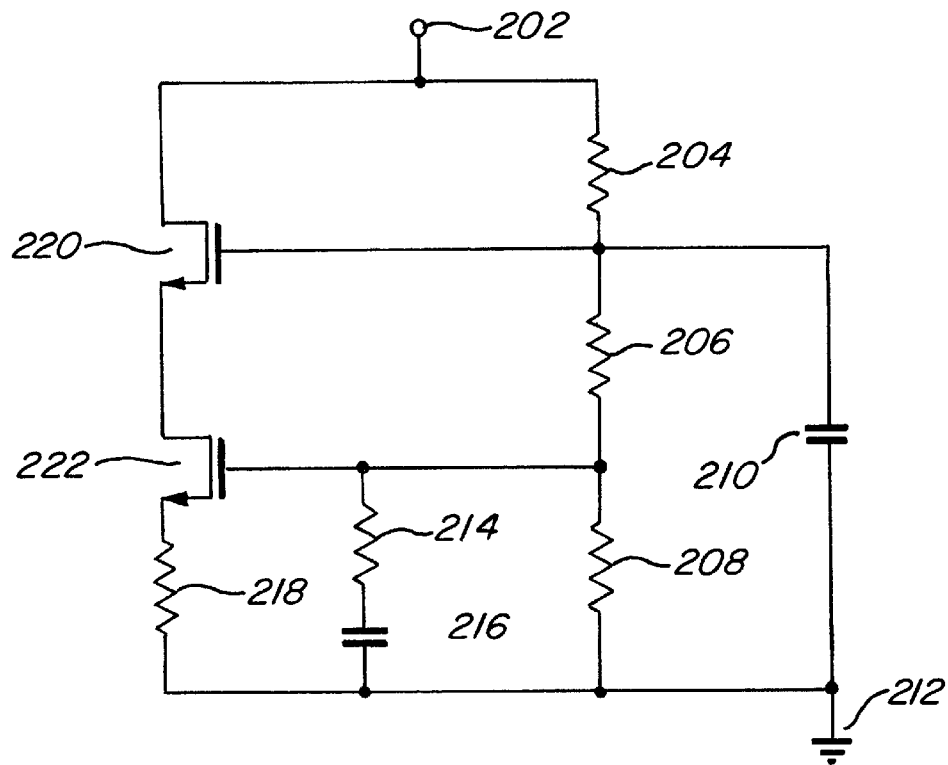
FIG. 8 is a schematic of a fourth embodiment of the present invention using MOSFET transistors.

The present invention may also be implemented using MOSFET technology instead of bipolar, since MOSFET devices exhibit similar heat affects. In MOSFETs, however, the impedance seen when looking into the drain increases with increased temperature. The transistors used are N-type enhancement mode MOSFETs. A MOSFET embodiment is illustrated in FIG. 8. The circuit construction is similar to the bipolar design, except that a Darlington pair configuration is not used. Also, the values of the bias resistors 204, 206, 208 are typically four to five times larger than in the bipolar design, in order to bias the MOSFETs in the active region. The bias resistor values are also dependent on the $V_T$ (threshold voltage) of the MOSFETs. Those skilled in the art can readily determine the appropriate bias resistor values.

Figure 9:
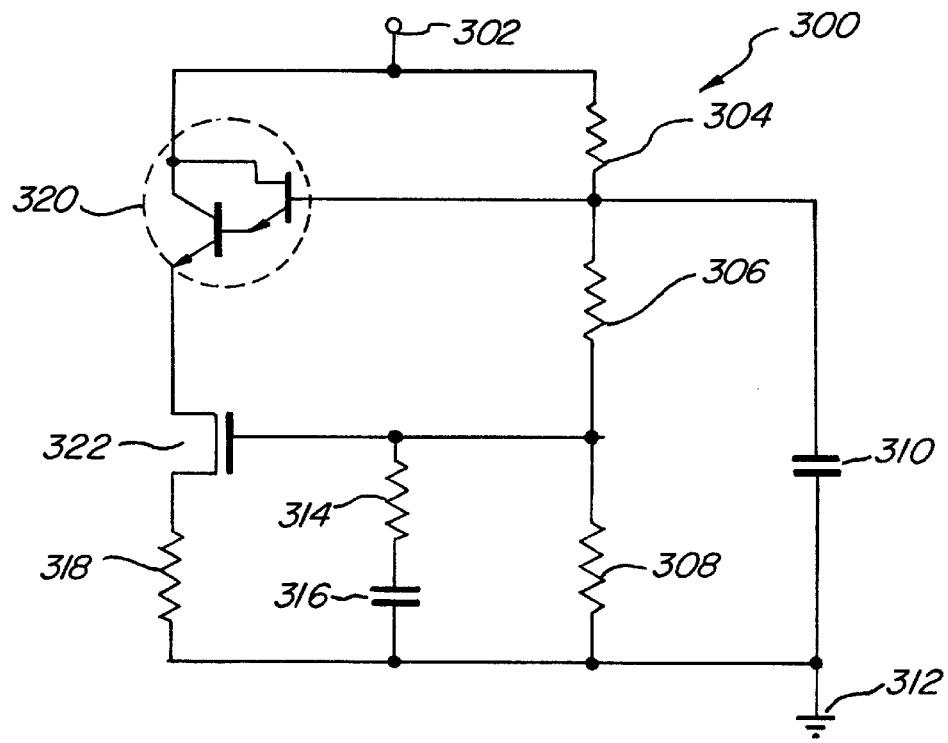
FIG. 9 is a schematic of a fifth embodiment of the present invention using one Darlington pair and one MOSFET transistor.
Figure 10:
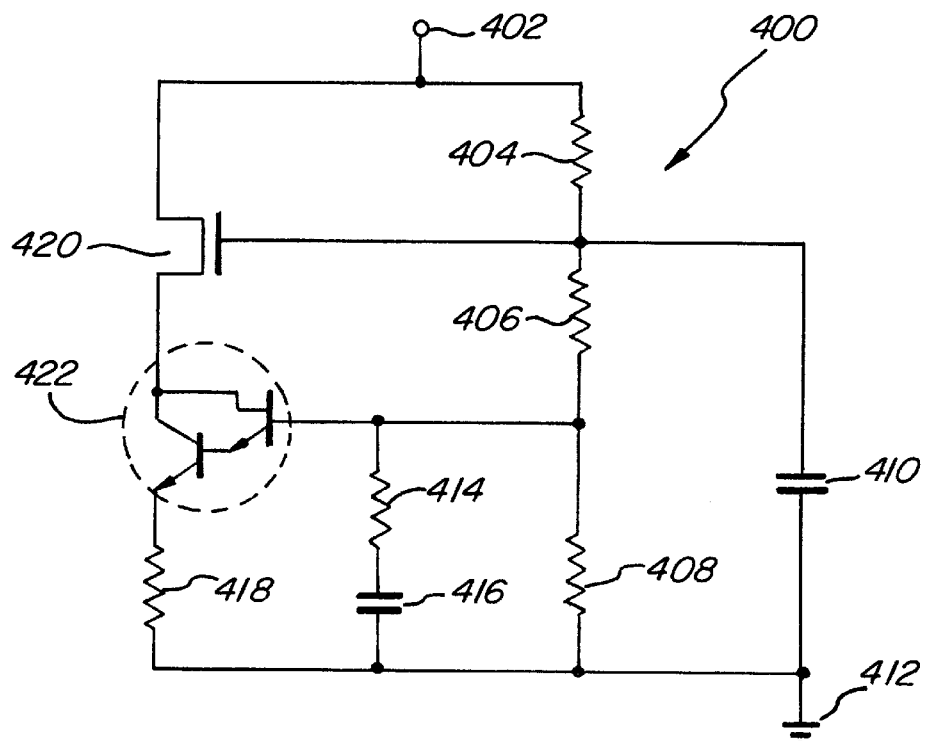
FIG. 10 is a schematic of sixth embodiment of the present invention using one MOSFET and one Darlington pair transistor in an alternative configuration.

A combined Bipolar/MOSFET configuration may also be constructed as shown in FIGS. 9 and 10. A bipolar Darlington pair may be used with a single MOSFET in order to achieve the desired circuit characteristics. Again, the bias resistor values will need to be adjusted to properly bias the transistors 320, 322 or 420, 422 in the active region.

Those skilled in the art will appreciate that various adaptations and modifications of the just-described preferred embodiments can be configured without departing from the scope and spirit of the invention. Therefore, it is to be understood that within the scope of the appended claims, the invention may be practiced other than as specifically described herein.

What is claimed is:

1. An electronic inductor circuit comprising:
   an input node connected to a telephone line;
   a ground node;
   a first transistor device having a first terminal connected to the input node, a second terminal and a third terminal;
   a second transistor device having a first terminal connected to the third terminal of the first transistor device, a second terminal and a third terminal;
   a resistor connected between the third terminal of the second transistor device and the ground node;
   a resistor biasing network connected between the input node and the ground node and to the second terminal of the first and second transistor devices for electrically biasing the transistor devices; and
   a capacitor connected between the second terminal of the first transistor device and the ground node.

2. The electronic inductor circuit of claim 1, wherein the first transistor device comprises two bipolar transistors arranged in a Darlington pair configuration having a collector for the first terminal, a base for the second terminal and an emitter for the third terminal.

3. The electronic inductor circuit of claim 2, wherein the second transistor device comprises two bipolar transistors arranged in a Darlington pair configuration having a collector for the first terminal, a base for the second terminal and an emitter for the third terminal.

4. The electronic inductor circuit of claim 3, wherein the resistor biasing network comprises:
   a first bias resistor connected between the input node and the base of the first Darlington pair;
   a second bias resistor connected between the base of the first Darlington pair and the base of the second Darlington pair; and
   a third bias resistor connected between the base of the second Darlington pair and the ground node.

5. The electronic inductor circuit of claim 3, wherein the resistor biasing network comprises:
   a first bias resistor connected between the input node and the base of the first Darlington pair;
   a second bias resistor connected between the base of the first Darlington pair and the ground node;
   a third bias resistor connected between the input node and the base of the second Darlington pair; and
   a fourth bias resistor connected between the base of the second Darlington pair and the ground node.

6. The electronic inductor circuit of claim 5, further comprising a fifth resistor and a second capacitor connected in series between the base of the second Darlington pair and the ground node.

7. The electronic inductor circuit of claim 1, wherein the first transistor device is a MOSFET transistor.

8. The electronic inductor circuit of claim 1, wherein the second transistor device is a MOSFET transistor.

9. The electronic inductor circuit of claim 1, wherein both transistor devices are MOSFET transistors.

10. The modem circuit of claim 5, further comprising a fifth resistor and a second capacitor connected in series between the base of the second Darlington pair and the ground node.

11. The modem circuit of claim 10, wherein the first transistor device is a MOSFET transistor.

12. The modem circuit of claim 11, wherein the second transistor device is a MOSFET transistor.

13. The electronic inductor circuit of claim 4, wherein the impedance looking into the collector of the first Darlington pair is approximately 10 to 100 orders of magnitude greater than the impedance of the first bias resistor.

14. A modem circuit comprising:
    a digital signal processor;
    a coder/decoder (codec) for interfacing with the digital signal processor; and a data access arrangement for interfacing the codec with a telephone line, wherein the data access arrangement comprises:
    voltage isolation means for isolating the the codes from the telephone line; and
    an electronic inductor, wherein the electronic inductor comprises:
        an input node connected to the telephone line;
        a ground node;
        a first transistor device having a first terminal connected to the input node, a second terminal and a third terminal;
        a second transistor device having a first terminal connected to the third terminal of the first transistor device, a second terminal and a third terminal;
        a resistor connected between the third terminal of the second transistor device and the ground node;
        a resistor biasing network connected between the input node and the ground node and to the second terminal of the first and second transistor devices for electrically biasing the transistor devices; and
        a capacitor connected between the second terminal of the first transistor device and the ground node.

15. The modem circuit of claim 14, wherein the first transistor device comprises two bipolar transistors arranged in a Darlington pair configuration having a collector for the first terminal, a base for the second terminal and an emitter for the third terminal.

16. The modem circuit of claim 15, wherein the second transistor device comprises two bipolar transistors arranged in a Darlington pair configuration having a collector for the first terminal, a base for the second terminal and an emitter for the third terminal.

17. The modem circuit of claim 16, wherein the resistor biasing network comprises:
    a first bias resistor connected between the input node and the base of the first Darlington pair;

a second bias resistor connected between the base of the first Darlington pair and the base of the second Darlington pair; and a third bias resistor connected between the base of the second Darlington pair and the ground node.

18. The modem circuit of claim 16, wherein the resistor biasing network comprises:

a first bias resistor connected between the input node and the base of the first Darlington pair;

a second bias resistor connected between the base of the first Darlington pair and the ground node;

a third bias resistor connected between the input node and the base of the second Darlington pair; and a fourth bias resistor connected between the base of the second Darlington pair and the ground node.

\* \* \* \* \*